(12) United States Patent
Auer

(10) Patent No.: US 6,367,635 B1
(45) Date of Patent: Apr. 9, 2002

(54) ULTRA PRECISION PROCESS CARRIER FOR SEMI-CONDUCTOR MANUFACTURING

(75) Inventor: Carl Auer, Fountain Hills, AZ (US)

(73) Assignee: Auer Precision Company, Inc., Mesa, AZ (US)

( * ) Notice: Subject to any disclaimer, the term of this patent is extended or adjusted under 35 U.S.C. 154(b) by 0 days.

(21) Appl. No.: 09/409,941

(22) Filed: Sep. 30, 1999

(51) Int. Cl.⁷ .................... A47G 19/08; H01L 21/76
(52) U.S. Cl. ................ 211/41.18; 438/401; 269/296
(58) Field of Search .................... 438/401; 269/286, 269/296; 29/25.01; 206/710–712, 454, 832–833; 211/41.18, 41.12, 40; 118/500; 414/935–941

(56) References Cited

U.S. PATENT DOCUMENTS

| | | | | |
|---|---|---|---|---|
| 3,486,631 A | * | 12/1969 | Rodman | 211/41.18 |
| 4,121,816 A | * | 10/1978 | Eads | 269/296 |
| 4,667,944 A | * | 5/1987 | Althouse | 269/21 |
| 5,180,150 A | * | 1/1993 | Prusak et al. | 269/254 |
| 5,318,190 A | * | 6/1994 | Mason | 211/41.18 |
| 5,538,230 A | * | 7/1996 | Sibley | 269/296 |
| 5,786,260 A | * | 7/1998 | Jang et al. | 438/401 |
| 5,943,588 A | * | 8/1999 | Watrobski et al. | 438/401 |

* cited by examiner

Primary Examiner—Daniel P. Stodola
Assistant Examiner—Jennifer E. Novosad
(74) Attorney, Agent, or Firm—John D. Titus; Gallagher & Kennedy P.A.

(57) ABSTRACT

An ultra precision stamped process carrier frame for use in the manufacture of microelectronic devices comprises a frame into which a plurality of precision-stamped apertures are made. Each of the coupon carrying apertures in the frame has a serrated side wall comprising a plurality of fingers extending into the aperture. The ends of the fingers are precision punched to define the aperture that registers the semiconductor coupon simultaneously with the punching of the reference fiducials. Since only the ends of the fingers are punched in the final process operation, the coupon-registering apertures can be held to a tighter tolerance relative to the fiducials and relative to each other than is possible when the entire side wall of the aperture is punched.

9 Claims, 7 Drawing Sheets

ULTRA PRECISION PROCESS CARRIER FOR SEMI-CONDUCTOR MANUFACTURING

INTRODUCTION

The present invention relates to carriers used in the test, assembly and packaging of semiconductors and other microelectronic devices.

In the manufacture of semiconductor products, it is often necessary to perform various die tests and other operations on the semiconductor die after they have been diced from the wafer. In order to perform these operations on the microscopic scales necessary, the fixtures used to hold the semiconductor die must be of very high precision. Conventionally, a semiconductor die is bonded to a flat substrate (often referred to as a coupon) within a very precise tolerance referenced to the edges of the coupon. The coupon is then loaded into an aperture in a multi-apertured rack for further processing. A conventional rack type fixture known as an AUER boat comprises a rack frame approximately 5 inches by 12 inches across containing typically from 5 to 50 apertures depending on the size of the coupons being handled. Each aperture in the rack is manufactured within a close tolerance relative to the size of the coupon such that the position of the die relative to the frame of the boat is known within sufficient tolerance to carry out the intended processing operation (e.g. probing, wire bonding, etc.). Conventionally, the frame of the AUER boat includes a plurality of small holes called "fidicuals", which are a precise distance from the center of the adjacent aperture. The fidicuals are used by the processing equipment as a reference to align the processing equipment to the aperture (and therefore to the die) prior to conducting the processing operation.

Because of the inherent tolerance limitations in the precision stamping process used to manufacture the frames, typically no better than plus or minus 0.005 inches from aperture to aperture, the processing equipment using such frames must align itself with each individual aperture before the process operation can take place. The necessity of aligning the processing equipment with each individual aperture has a dilitarious effect on the maximum throughput of the processing equipment. Other methods of manufacturing the frame such as milling or EDM could yield a frame within tighter tolerances but only at exorbitant costs. Accordingly, what is needed is a method of precision stamping multi-apertured process carrier frames within ultra-precise tolerances such that the semiconductor processing equipment can align itself once with the frame and conduct the processing operations on all the die carried by the frame without the necessity of realigning itself to each individual aperture.

SUMMARY OF THE INVENTION

The present invention comprises an ultra precision stamped process carrier frame for use in the manufacture of semiconductors, liquid crystal displays, micromachines and other microelectronic devices. According to a preferred embodiment of the process carrier, each of the coupon carrying apertures in the frame has a serrated side wall comprising a plurality of fingers extending into the aperture. The tips of the fingers define the aperture that registers the semiconductor coupon. Because only the tips of the fingers are shaved in the final process step, the registration apertures can be held to a tighter tolerance relative to the fidicual than is possible when the entire side wall of the aperture is punched.

According to a preferred method of manufacturing the precision carrier, the rough aperture for the coupon is initially stamped in the carrier frame such that the fingers extend into the aperture further than the finished dimension (i.e. the aperture is undersized). Since the initial act of opening the apertures in the frame will necessarily relieve internal stresses in the material, the frame will inherently become warped. Therefore, the unfinished carrier plate is preferably processed through a conventional flattening machine to restore the original flatness (at the cost of some elongation and other distortion of the unfinished apertures). The mechanically and or thermally stress relieved and flattened process carrier plate is then subjected to an additional die punching operation in which the tips of the fingers of all of the apertures in the plate are shaved to the finished dimension and the fidicual holes punched in the plate all in one simultaneous operation. Since all of the apertures in the plate are finished to the final dimension simultaneously with each other and with the punching of the fidicuals, the aperture-to-aperture tolerance as well as the aperture-to-fidicual tolerance is limited only by the precision to which the punch itself is manufactured. Thus, tolerances of plus or minus 0.001 inch or better can be achieved across the entire frame. The finished stamping process may be carried out at a temperature other than ambiant in order to further increase precision, that is, if the customer user point carrier temperature is greater than ambiant, the finished stamping process may be carried out at the user point carrier temperature in order to ensure that the process carrier plate does not go out of tolerance as the result of the thermal coefficient of expansion of the plate material. Additionally, performing the finished stamping operation at above or below the customer user point carrier temperature may permit the operation to be "tweeked" to allow the thermal coefficient of expansion of the material to grow or shrink the part as necessary to meet customer requirements.

BRIEF DESCRIPTION OF THE DRAWING

The present invention will be better understood from a reading of the following detailed description, taken in conjunction with the accompanying drawing figures in which like references designate like elements and in which.

DETAILED DESCRIPTION

Figure 1:
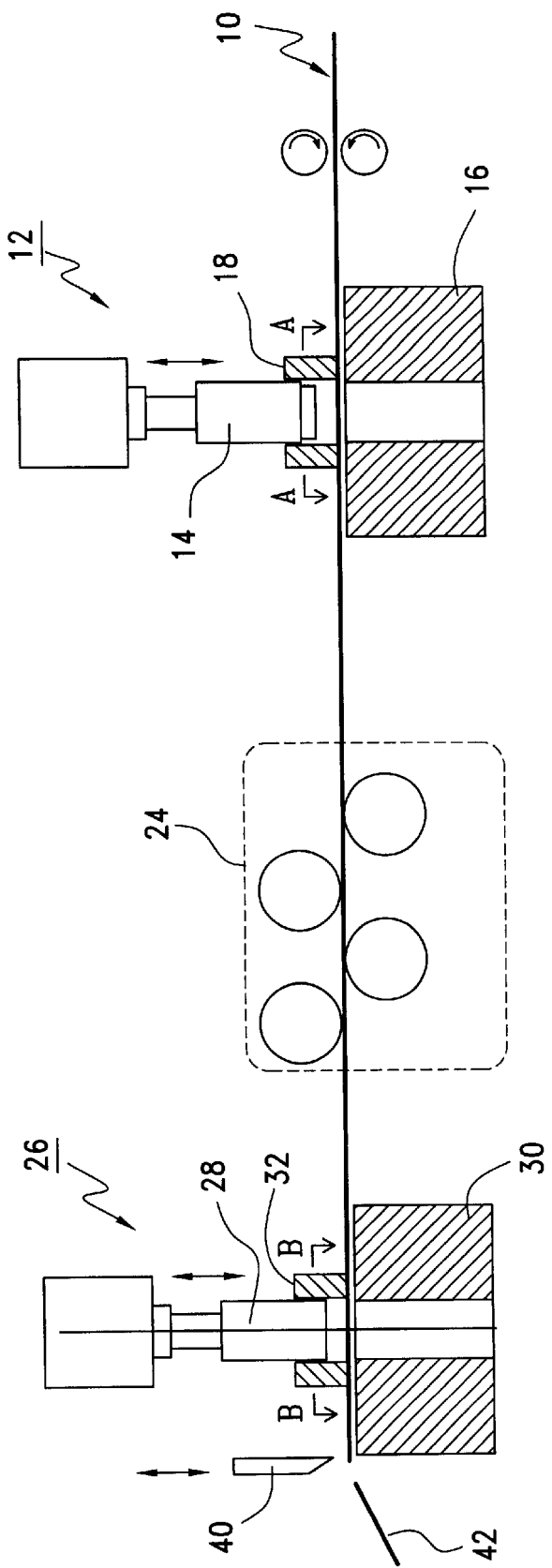
FIG. 1 is a schematic representation of a process for producing process carrier plates according to the prior art.
Figure 3:
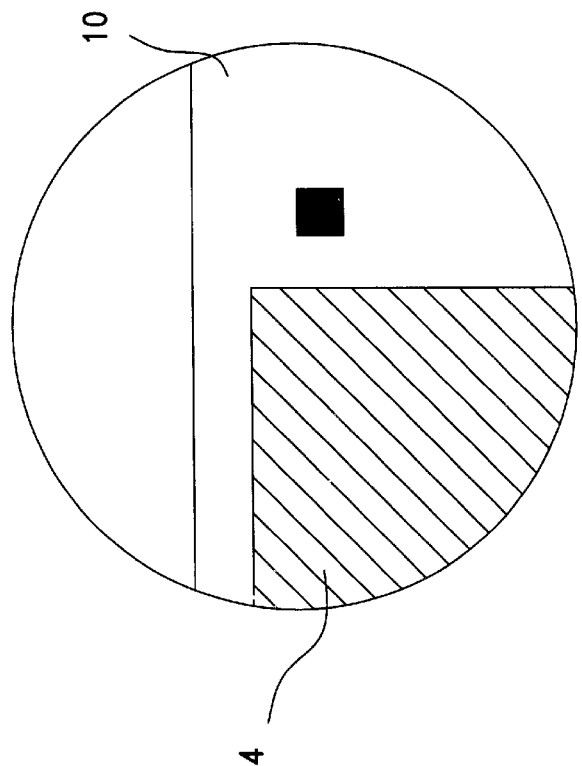
FIG. 3 is an enlarged view of a portion of FIG. 2.

The drawing figures are intended to illustrate the general manner of construction and are not necessarily to scale. In the description and in the claims the terms left, right, front and back and the like are used for descriptive purposes. However, it is understood that the embodiment of the invention described herein is capable of operation in other orientations that is shown and terms so used are only for the purpose of describing relative positions and are interchangeable under appropriate circumstances.

Figure 2:
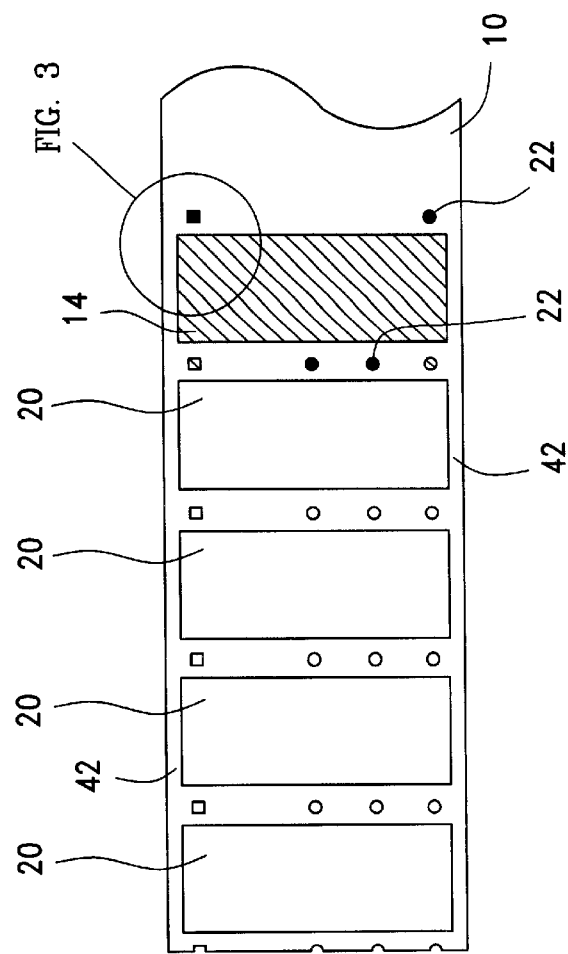
FIG. 2 is a plan view of a semi-finished prior art process carrier plate.
Figure 5:
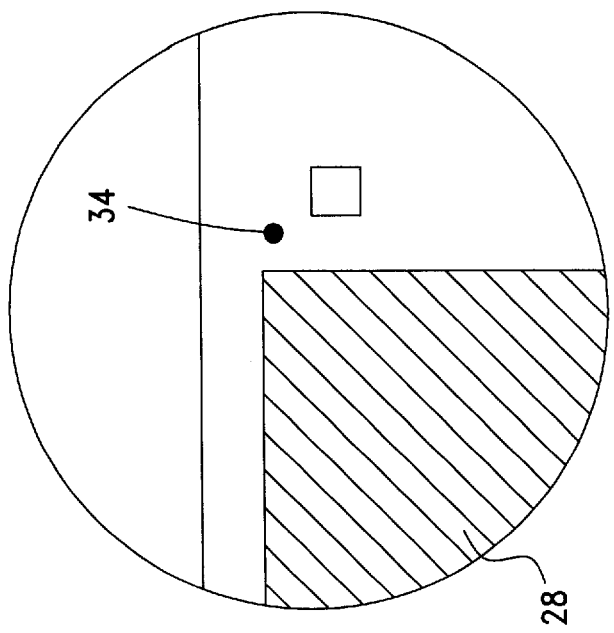
FIG. 5 is an enlarged view of a portion of FIG. 4.
Figure 4:
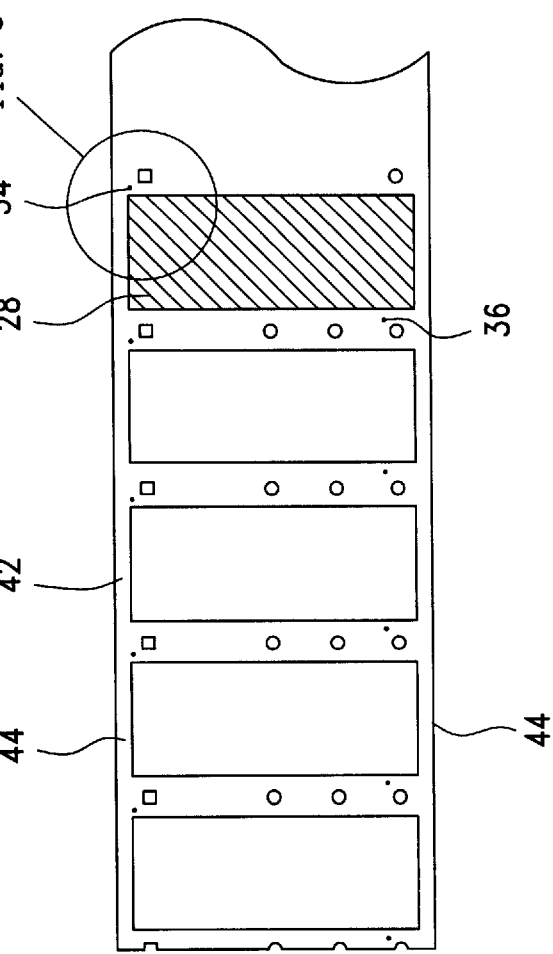
FIG. 4 is a plan view of a nearly completed prior art process carrier.

With reference to FIGS. 1 through 5, according to a prior art method of manufacturing a process carrier plate, a stip of flat material 10 is fed into a progressive die punching apparatus 12 comprising a reciprocating punch 14 and corresponding die 16. As shown in FIG. 2, (view A—A of FIG. 1) as the material 10 advances, a series of rough cut apertures 20 are successively punched in material 10. In addition to the rough cut apertures 20, a plurality of pilot holes such as pilot holes 22 are punched in material 10. Pilot holes 22 are used as a reference for aligning each successive rough cut aperture 20 in the first stage of the progressive punching operation and are also used in the finish step, described hereinafter. A die guide known as a "stripper" 18 is indexed to the die 16 by means of pins that engage the stripper and die through the pilot holes 22. (The punch 14 is shown cross-hatched in the view of FIG. 2. The die guide is omitted from the plan views for clarity.) Since the formation of the apertures 20 in the material 10 inherently relieves internal stresses within the material 10, formation of the apertures will inherently lead to some warpage or other distortion of the previously flat material 10. Accordingly, after the rough cut apertures 20 are formed in material 10, material 10 is fed through a flattening machine 24 such as a roller flattener manufactured by the Bruderer Company of Switzerland, to restore the original flatness of material 10. Once the rough cut material 10 has been restored to its proper flatness, it is fed into a second die punching apparatus 26 comprising a punch 28, die 30 and stipper 32 for finishing each aperture sequentially to the final dimensions. The fidicual holes 34 and 36 are punched simultaneously with the shaving of apertures 20. Then, the strip of material 10 with the apertures 20 at their finished dimension are then trimmed by a shear 40 into individual frames 42. Since the fidicual holes 34 and 36 are punched simultaneously with the shaving of the adjacent aperture, the positional tolerance between the fidicual holes and the adjacent aperture can be held quite closely. However, the positional tolerance between adjacent apertures cannot be held to the same tolerance in a progressive die punching operation because the aperture-to-aperture tolerance is a combination of the clearance between the punch and the stripper, the stripper and the pilot punch clearance, and the location variance between adjacent apertures resulting from imprecision in the original rough punching of the apertures.

It has been suggested that greater positional precision could be obtained by foregoing a progressive die punching operation in favor of a single pass punch in which all cavities in a single frame are punched simultaneously with the fidicuals. However, as discussed hereinbefore, formation of the apertures will invariably result in warpage of the frame as the result of relieving the internal stresses inherent in the material. The flattening operation restores flatness, but only at the cost of inducing unpredictable elongation and/or other changes in dimensions of the part. Moreover, since the total force necessary to complete the punching operation is directly proportional to the total perimeter being cut, a single pass punching operation would require a punch and die having five or more times the capacity of the punch needed for a progressive punching operation. Finally, even if the apertures are roughed and the frame flattened before a single pass aperture shave and fiducial punch, since the shaving operation involves the shearing of material generally along straight lines with no discontinuities to allow the frame to relieve stresses, even the shaving operation will induce unacceptable distortions as a result of stress relieving the material. Moreover, because the frame rails 44 remaining after the rough punching of apertures 20 are relatively thin, additional shaving operations on the unsupported frame rails also tend to distort the apertures. Accordingly, it has not been heretofore possible to maintain a plus or a minus 0.001 inch positional tolerance across the entirety of frame 42.

Figure 6:
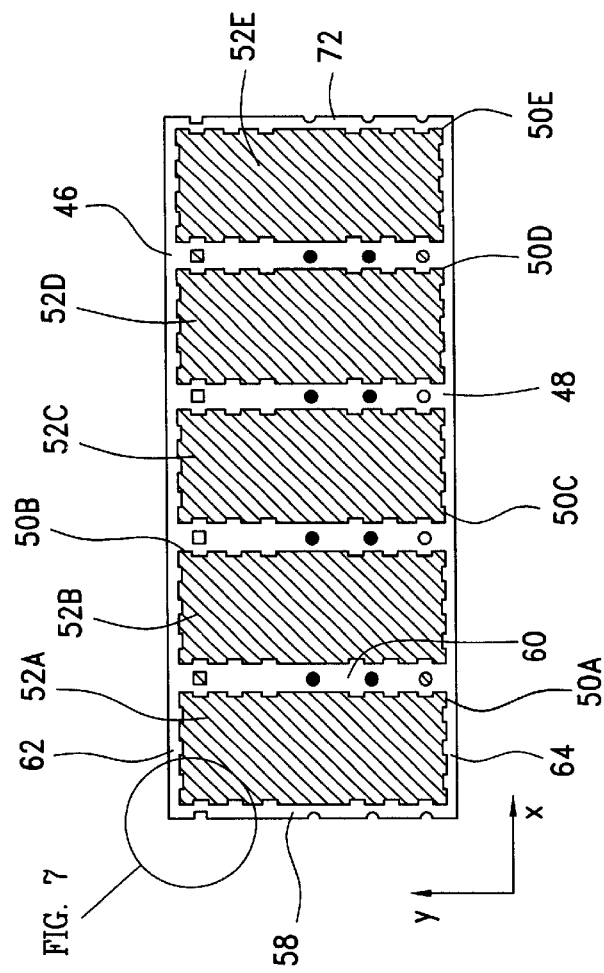
FIG. 6 is a plan view of a semi-finished process carrier incorporating features of the present invention.
Figure 7:
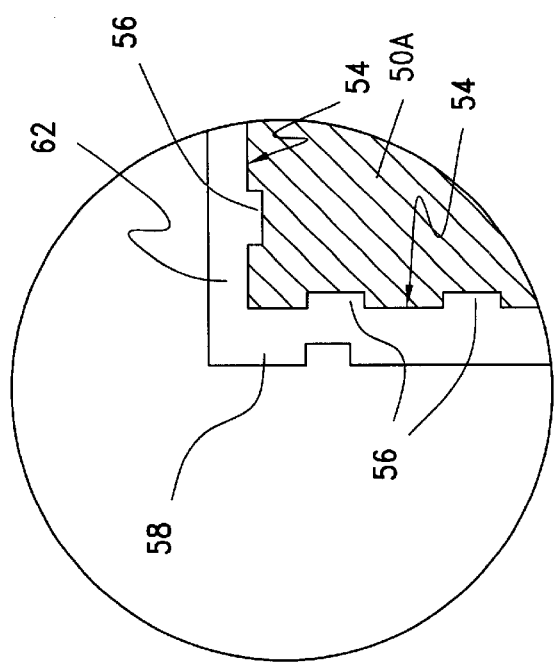
FIG. 7 is an enlarged view of a portion of FIG. 6.
Figure 8:
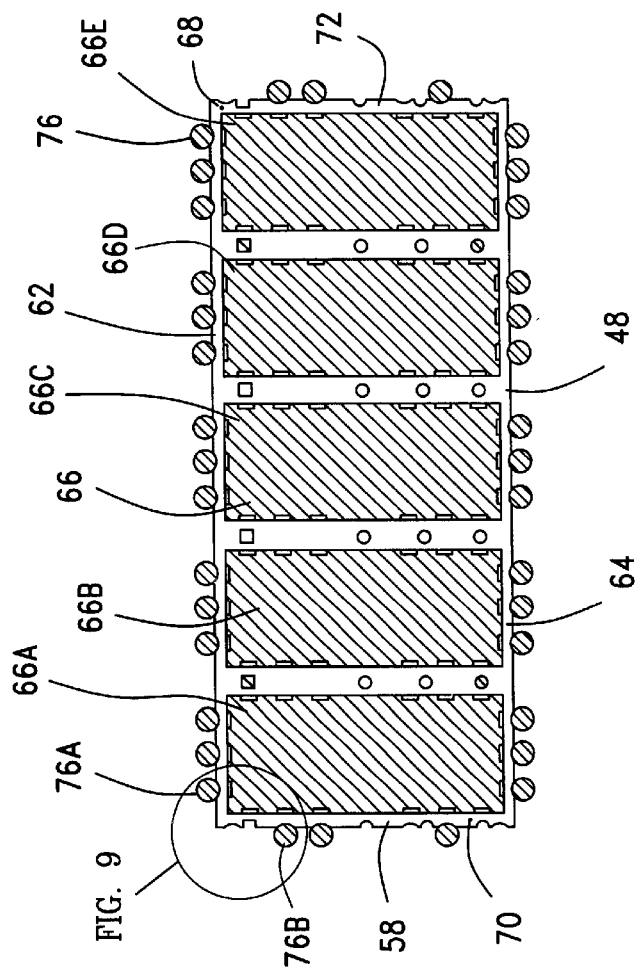
FIG. 8 is a plan view of a process carrier incorporating features of the present invention during the final process steps.
Figure 9:
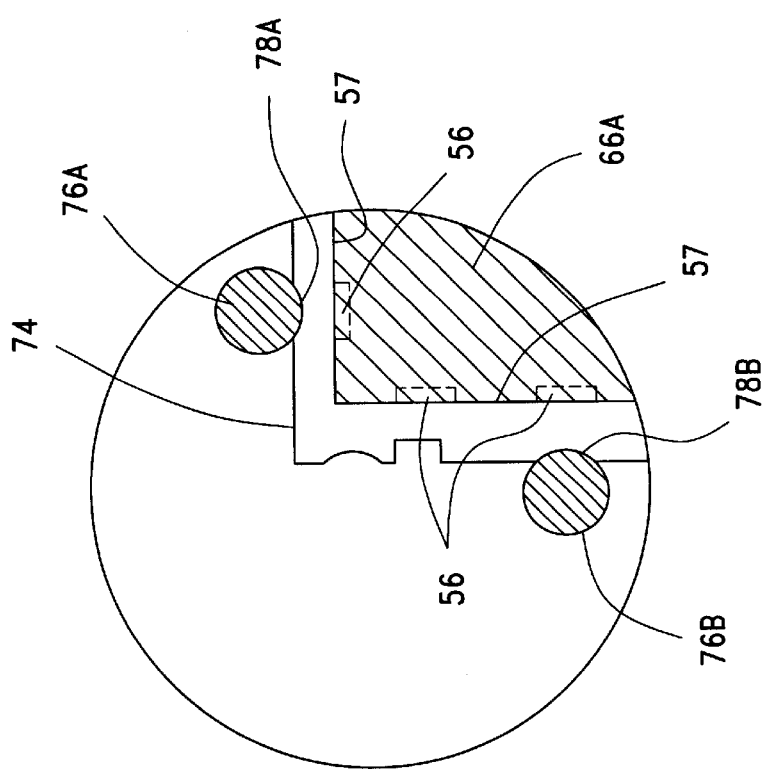
FIG. 9 is an enlarged view of a portion of FIG. 8.

With reference to FIGS. 6–11, a process carrier plate for use in the manufacture of microelectronic devices in accordance with the present invention comprises a frame 48 into which a plurality of rough cut apertures 50A–50E are formed. Although FIG. 6 shows each of apertures 50A–50E formed by a single stroke of a punch consisting of punch members 52A–52E, in the preferred embodiment, apertures 50A–50E are formed progressively. The features of each of the apertures 50A–50E are substantially identical. Accordingly only aperture 50A will be discussed in detail. As shown more clearly in FIG. 7, aperture 50A has a serrated lateral wall 54, the serrations being formed by a plurality of tabs or fingers 56 which extend inward into the aperture 50A from side rails 58 and 60 as well as top rail 62 and bottom rail 64 of frame 48. As with the prior art stamping operations, formation of apertures 50A–50E inherently relieves internal stresses within frame 48, which causes it to warp. Accordingly, preferably frame 48 is restored to its original flatness using a conventional roller flattener such as the aforementioned Bruderer machine. Once the frame 48 has been restored to its original flatness, as shown in FIGS. 8 and 9, tabs 56 of each of apertures 50A–50E are trimmed simultaneously to the finished dimension by a single punch 66 comprising punch members 66A–66E. Simultaneously with the trimming of tabs 56, fidicuals 68 and 70 are punched in frame 48 by punch extensions (not shown) incorporated into punch 66. Since the operation depicted in FIGS. 8 and 9 consist of the trimming of tabs rather than the shearing of the entire perimeter of apertures 50A–50E, frame 48 is not distorted by the trimming operation. This is because the discontinuities between adjacent tabs 56 allow frame 48 to completely stress relieve itself in the first rough aperture punching operation. The residual stresses in the tabs 56 themselves have no line of action through which to act to distort frame 48. Accordingly, trimming the tabs 56 of all of apertures 50A–50E simultaneously with each other and with the punching of the fiducials 68 and 70 permits these features to be formed in such a way that no residual stresses are relieved that would warp frame 48. Since the coupons that are carried by the frame generally have straight, rectangular (including square) sides, it is immaterial that the root portions 57 of apertures are not tightly controlled because the coupon will register itself against only the precision sheared tips of the tabs 56. Therefore, the functional aperture-to-aperture positional tolerance (as defined by the locus of points defined by the tips of tabs 56) is limited only by the precision of the punch itself and the small amount of movement of the rails 58, 62, 64 and 72 as these move away from the punch during the punching operation. Accordingly, by incorporating the serrated lateral walls in apertures 50A–50E as disclosed herein together with the simultaneous trimming of the tabs 56, a significant improvement in positional tolerance can be realized.

Figure 11:
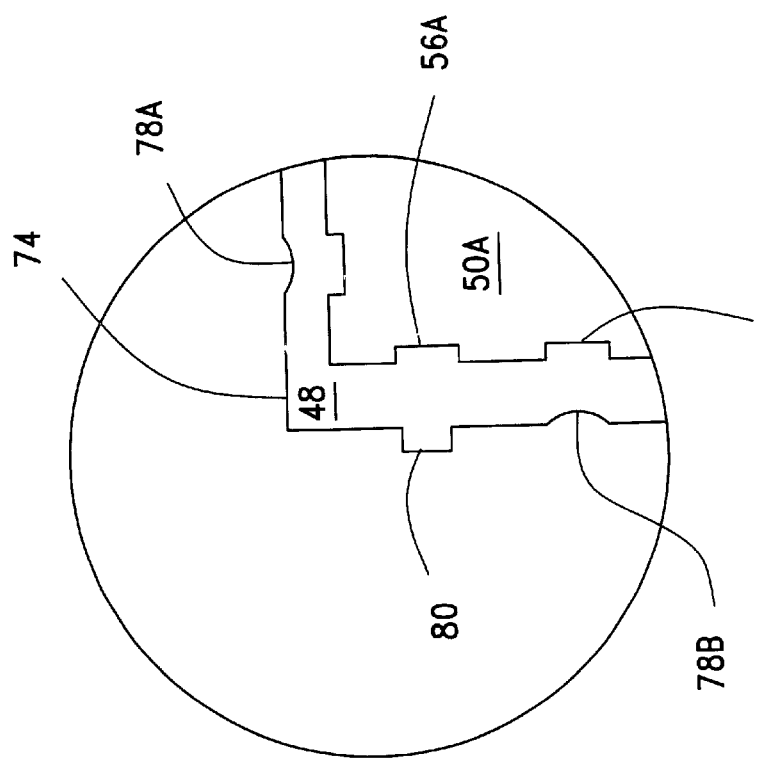
FIG. 11 is an enlarged view of a portion of FIG. 10.

The positional tolerance of the aperture defined by the tips of tabs 56 can be further improved by constraining rails 58, 62, 64 and 72 of frame 48 from moving away from die 66 during the tab trimming operation. In the embodiment of FIGS. 8 and 9, this is accomplished by trimming an approximately equal and opposite amount of material from the outer perimeter 74 of frame 48 from each of the tabs 56 being trimmed. In the embodiment of FIG. 8, the trimming is accomplished by a plurality of cylindrical punches 76A–76B (FIG. 9) each of which trims an arcuate scallop 78A and 78B, respectively, from outer perimeter 74 of frame 48 simultaneously with the trimming of tabs 56. Although an arcuate scallop formed by a circular punch is shown in the embodiment of FIG. 8, other methods of creating an equal and opposite reaction to stabilize frame 48 during the tab trimming process are feasible, for example, as shown in FIG. 11, a plurality of tabs 80 extending outward from outer perimeter 74 of frame 48 may be formed opposite tabs 56. The outer tabs 80 are then trimmed simultaneously with tabs 56 to create the necessary counteracting force.

Figure 10:
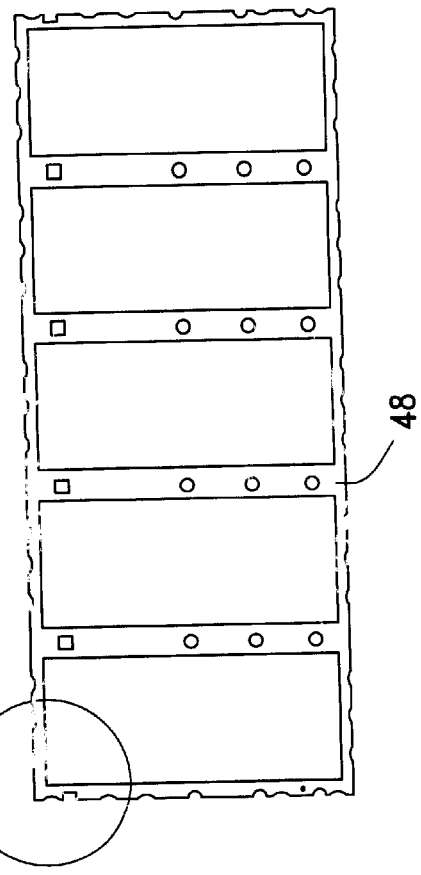
FIG. 10 is a plan view of a completed process carrier incorporating features of the present invention.

As shown in FIG. 10, when manufactured in accordance with the foregoing disclosure, frame 48 is capable of achieving a window-to-window tolerance of less than plus or minus 0.001 inch across the entire approximately 12 inches of the frame 48.

Figure 12:
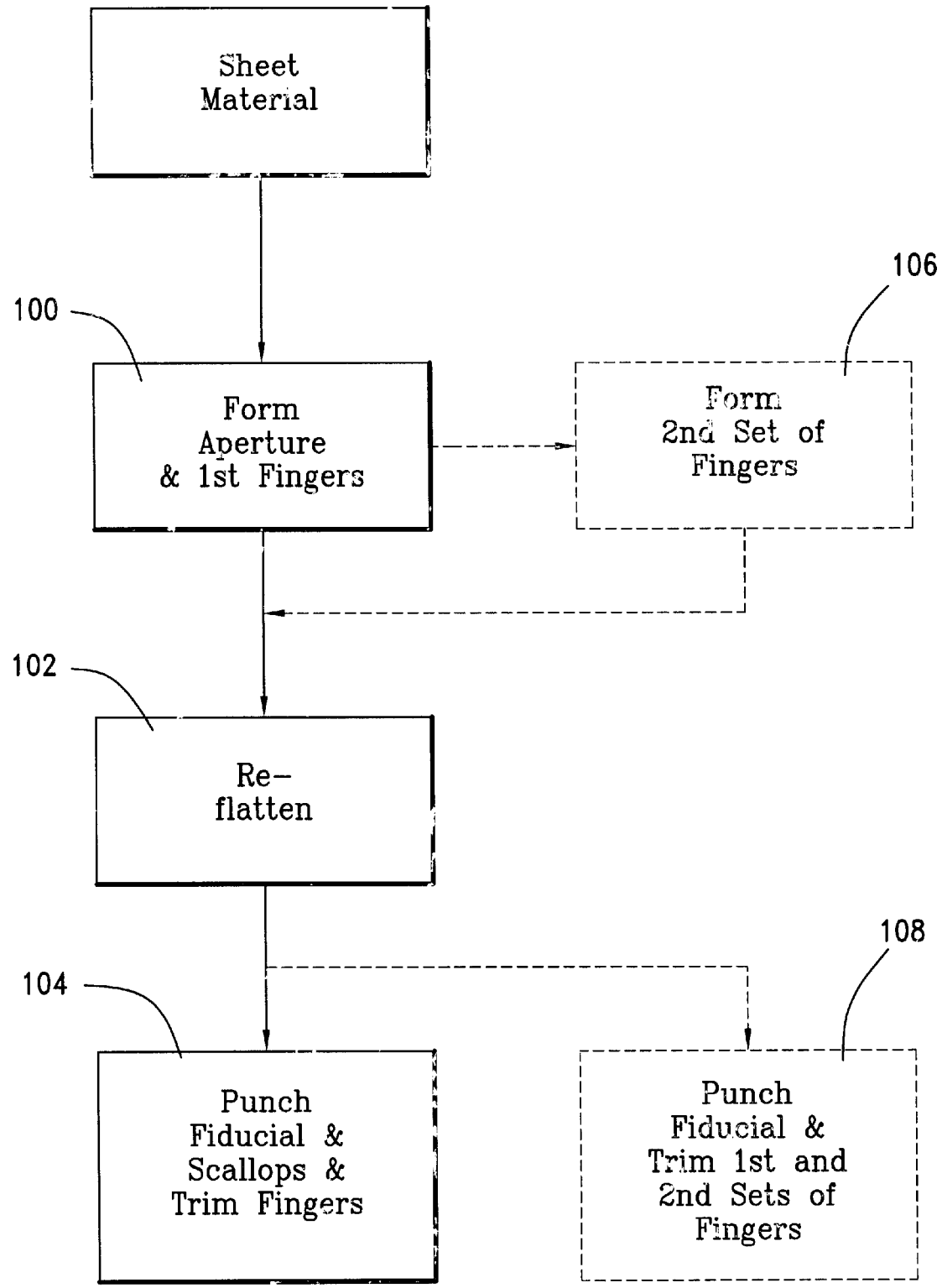
FIG. 12 is a flow chart showing a process for manufacturing a process carrier incorporating features of the present invention.

FIG. 12 is a flow chart summarizing the foregoing processing steps. As shown in FIG. 12, the sheet material 10 is fed into a progressive or single pass punch to form the apertures 50A–50E having the inwardly extending tabs shown at reference 100. The frame is then preferably reflattened as shown at reference 102 and thereafter, as shown in reference 104, the tabs extending into the apertures are trimmed and, simultaneously therewith, the fiducials are punched and the scallops trimmed in order to provide a counteracting force to the tab trimming operation. Optionally, as shown at reference 106, a second set of fingers or other protrusions can be formed in the outer perimeter of frame 48 in which case, as shown at reference 108, in lieu of punching the scallops to create a stabilizing counteracting force, the second set of outwardly extending tabs are trimmed simultaneously with the trimming of the inwardly extending tabs and the punching of the fiducials.

To further increase the accuracy of the parts produced according to the foregoing process, where the customer has specified a manufacturing temperature, known as the customer use point carrier temperature, the foregoing finish punching operation (104 or 108) can be performed at the customer use point temperature thereby limiting the dilatarious effects of the thermal coefficient of expansion of the material 10 out of which frame 48 is made. Alternatively, the punch and die set may be manufactured purposely undersized or oversized to account for the thermal growth of frame 48 between the manufacturing temperature and the customer use point carrier temperature.

Although certain preferred embodiments and methods have been disclosed herein, it will be apparent from the foregoing disclosure to those skilled in the art that variations and modifications of such embodiments may be made without departing from the spirit and scope of the invention. For an example, although tabs 56 are generally shown in the illustrated embodiments as having a rectangular shape such as tab 56A of FIG. 11, other shapes such as a trapezoid as illustrated by tab 56B of FIG. 11 as long as the side walls of the tabs are sufficiently discontinuous from the rails 58, 62, 64 and 72 of frame 48 to allow the frame 48 to stress relieve itself after the initial rough cutting of the apertures but not to exhibit significant warpage due to stress relief as a result of the trimming of tabs 56. Accordingly, it is intended that the invention shall be limited only to the extent required by the appended claims and the rules and principals of applicable law.

What is claimed is:

1. A process carrier plate for use in the manufacture of microelectronic devices comprising:

a frame comprising a flat sheet of material having a front side and a back side, the frame having at least one aperture extending through the frame from the front side to the back side, the at least one aperture having a continuous lateral wall comprising a plurality of serrations, the plurality of serrations comprising a plurality of fingers each extending inward into the aperture from the lateral wall, each of the plurality of fingers having a tip and a root portion, the plurality of fingers formed such that the locus of points comprising the inwardmost edge of the tip portions of the plurality of fingers define a regular polygon sized and shaped to accept and register a microelectronic device coupon within a predetermined tolerance, the frame further comprising at least one fiducial hole passing through from the front side to the back side, the fiducial hole being positioned within a predetermined tolerance relative to the locus of points comprising the inwardmost edge of the tip portions of the plurality of fingers so as to define a reference point relative to a coupon held in the process carrier plate and registered by said plurality of fingers.

2. The process carrier plate of claim 1, wherein:

the locus of points defines a rectangle.

3. The process carrier plate of claim 1, wherein:

selected ones of the plurality of fingers are rectangular in shape.

4. The process carrier plate of claim 1, wherein:

selected ones of the plurality of fingers are trapezoidal in shape.

5. The process carrier plate of claim 1, wherein:

each of the plurality of fingers is trapezoidal in shape.

6. The process carrier plate of claim 5, wherein:

the recesses comprise arcuate-walled scalloped recesses.

7. The process carrier plate of claim 1, further comprising:

a plurality of recesses formed in the outer perimeter of the frame.

8. The process carrier plate of claim 1, further comprising:

a second plurality of fingers integral to the frame extending outward from the perimeter of the frame.

9. The process carrier plate of claim 1, wherein:

said at least one aperture comprises a plurality of apertures.

\* \* \* \* \*